(12) United States Patent
Laquai

(10) Patent No.: US 9,300,309 B2
(45) Date of Patent: Mar. 29, 2016

(54) APPARATUS AND METHOD FOR SOURCE SYNCHRONOUS TESTING OF SIGNAL CONVERTERS

(75) Inventor: Bernd Laquai, Stuttgart (DE)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 13/640,287

(22) PCT Filed: Apr. 9, 2010

(86) PCT No.: PCT/EP2010/054726
§ 371 (c)(1),
(2), (4) Date: Apr. 28, 2015

(87) PCT Pub. No.: WO2011/124265
PCT Pub. Date: Oct. 13, 2011

(65) Prior Publication Data
US 2015/0288373 A1     Oct. 8, 2015

(51) Int. Cl.
*H03M 1/10* (2006.01)
*H03M 1/06* (2006.01)
*H03M 1/12* (2006.01)

(52) U.S. Cl.
CPC .......... *H03M 1/0624* (2013.01); *H03M 1/1071* (2013.01); *H03M 1/12* (2013.01)

(58) Field of Classification Search
CPC ........................ H03M 1/0624; H03M 1/1071
USPC .......................................................... 341/120
See application file for complete search history.

(56) References Cited

U.S. PATENT DOCUMENTS

| | | | | |
|---|---|---|---|---|
| 4,465,995 A | * | 8/1984 | Sloane | 341/120 |
| 5,063,383 A | * | 11/1991 | Bobba | 341/120 |
| 5,659,312 A | * | 8/1997 | Sunter et al. | 341/120 |
| 6,100,828 A | * | 8/2000 | Sparks | 341/120 |

* cited by examiner

*Primary Examiner* — Khai M Nguyen

(57) ABSTRACT

An automatic tester, comprising a first signal converter, a first signal path, and a second signal path. The first signal converter is operable to convert, using a conversion clock signal, a signal from a digital signal domain to an analog signal domain to acquire an analog stimulus signal. The first signal path is operable to forward the analog stimulus signal from the first signal converter to a second signal converter operable to convert the analog stimulus signal back from the analog signal domain to the digital signal domain. The second signal path is operable to forward one of the conversion clock signal and a signal derived thereof from the first signal converter to the second signal converter. A difference between a propagation delay of an analog stimulus signal in response to a clock cycle of the conversion clock signal via the first signal path and a propagation delay of the conversion clock signal of the clock cycle via the second signal path is within a predetermined tolerance range.

17 Claims, 9 Drawing Sheets

APPARATUS AND METHOD FOR SOURCE SYNCHRONOUS TESTING OF SIGNAL CONVERTERS

CROSS-REFERENCES TO RELATED APPLICATIONS

This application is a Continuation of and claims priority to International Application No. PCT/EP2010/054726, filed on Apr. 9, 2010, titled "APPARATUS AND METHOD FOR SOURCE SYNCHRONOUS TESTING OF SIGNAL CONVERTERS," by Bernd Laquai, which is herein incorporated by reference.

TECHNICAL FIELD

Embodiments of this present invention relate to automatic test equipment (ATE) and, in particular, to source synchronous automatic testing of signal converters analog-to-digital converters (ADC) or digital-to-analog converters (DAC).

BACKGROUND

As a conversion frequency of analog-to-digital converters (ADC) or digital-to-analog converters (DAC) increases, the challenge of evaluating the performance of such signal converters in production-scale quantities becomes progressively more difficult. One difficulty stems from conventional modes of testing signal converters, which, at higher frequencies, tend to reflect the combined performance of the device under test (DUT) and the test hardware, rather than the performance of the DUT alone.

When testing high speed and high performance ADCs and DACs in the GHz (Giga Hertz) frequency range, the limiting factor for performance on conventional ATE is determined more and more by jitter in the stimulus and conversion (sampling) clock signal. Jitter is the time variation of a periodic signal, often in relation to a reference clock source. Jitter may be observed in characteristics such as a frequency of successive pulses, or a phase of periodic signals. In respect to performance of ATE, however, a common assumption is that the limiting effect is caused by jitter in the conversion clock alone. Therefore, high costs and high development efforts are commonly expended in providing ultra-low jitter clocks, e.g. by developing low-jitter clock generators incorporating sophisticated phase-locked-loop (PLL) architectures.

ATE systems commonly use so-called arbitrary waveform generators (AWG) as an extremely flexible stimulus signal source for testing DUTs, such as, e.g., ADCs or DACs. Although other embodiments are conceivable, some AWGs synthesize waveforms using digital signal processing techniques, such as, e.g., so-called direct digital synthesis (DDS). Here, amplitude values of a period of an arbitrary 2m-periodic stimulus signal are stored as a so-called look-up table (LUT) in a computer memory, such as, e.g., a read-only memory (ROM). Advantageously, as many amplitude values as possible are stored at an as good as possible amplitude resolution. A direct digital synthesizer numerically calculates, in each clock cycle of a conversion clock signal, a digital phase φ of the periodic signal using a so-called phase accumulator, and determines associated digital amplitude values using the look-up table. Finally, an analog output signal is generated by a DAC from the digital amplitude values. A so-called tuning word forms the phase increment Δφ of the phase accumulator. That is, in a clock cycle n, phase φ[n] of the phase accumulator is increased by the phase increment Δφ, such as: φ[n]=φ[n−1]+Δφ. A digital phase word of the accumulator consists of a specific number of bits. Each time the phase accumulator overflows, a complete period of the periodic signal is generated. For this reason, phase increment Δφ of the phase accumulator, and the conversion clock frequency $f_{CLK}$ of the direct digital synthesizer define an output frequency $f_{STIM}$ of the sinusoidal analog stimulus signal generated by the AWG or the DDS. The data used by an AWG for generating the analog stimulus signal for a DUT are typically ideally equidistant samples of a sine wave, wherein the conversion clock frequency $f_{CLK}$ may be lower than, equal to, or higher than the generated output or stimulus frequency $f_{STIM}$, depending on the phase increment. However, when the conversion clock contains jitter, the samples are output with offsets to the desired points in time. When the DUT, however, samples the AWG output signal (stimulus signal) using a stable sampling clock, the sampled DUT input signal appears to be phase modulated. In case the jitter is sinusoidal with a frequency of $f_J$, the sampled signal shows side lobes in its spectrum at frequencies $f_{STIM} \pm m \cdot f_J$ at amplitudes given by the Bessel functions of n-th order $J_n(x)$, wherein $x=\pi^* T_{jpp}^* f_{STIM}$ and $T_{jpp}$ denotes a time between two subsequent peaks of a sinusoidal jitter.

FIG. 1 illustrates an exemplary spectrum for a generated sign wave test or stimulus signal with frequency $f_{STIM}$=100 MHz that contains 30 ps (pico seconds) sinusoidal peak-to-peak jitter ($f_J$=2 MHz). Since the phase modulation depth is small, the dominant spur is the first sidelobe at $f_{STIM} \pm f_J$ that determines the signal-to-noise ratio (SNR). Its amplitude can be derived from the Bessel function of first order $J_1(x)$ which, for the case of small amplitudes x can be approximated by $J_1(x) \approx x/2$. Hence, the SNR may be expressed as:

$$\text{SNR[dB]}=-20 \cdot \log_{10}(\pi/2 \cdot T_{jpp} \cdot f_{STIM}), \quad (1)$$

wherein $T_{jpp}$ denotes a time between two subsequent peaks of the sinusoidal jitter. FIG. 2 illustrates the relationship expressed by Eq. (1) for a stable $f_{STIM}$=100 MHz ADC input signal versus the sinusoidal peak-to-peak jitter injected into the sampling clock of the ADC. Since the specified SNR for a state-of-the-art ADC (e.g. for a 200 Msps 16 bit ADC, Msps=Mega samples per second) is in the range of 70 dBc, a limit for the jitter between an input stimulus or test signal and a sampling clock is in the range of 2 ps peak-to-peak.

The generation of a low-jitter-clock with less than 2 ps peak-to-peak jitter in an ATE is challenging. However, it is even more challenging to distribute it to the many clock units in a large and complex system-on-chip (SoC) ATE and to the DUT keeping the jitter this low. Typically, when an ADC or DAC is to be tested in a test SoC device, the stimulus signal is generated in a mixed signal channel that derives its AWG conversion clock from a clock board that is synchronized with a PLL to a broadly distributed master clock. In contrast, a clock used as a conversion clock of the DUT ADC is generated from a digital channel using independent timing generators clocked from a different clock board that is also synchronized to the master clock with a PLL of its own.

SUMMARY

In a test system according one embodiment of the present invention, an automatic tester may have a first signal converter for converting, using a conversion clock signal, a signal from a digital signal domain to an analog signal domain to acquire an analog stimulus signal; a first signal path for forwarding the analog stimulus signal from the first signal converter to a second signal converter, which is adapted to convert the analog stimulus signal back from the analog signal domain to the digital signal domain; and a second signal path for forwarding the conversion clock signal or a signal derived thereof from the first signal converter to the second signal converter, such that a difference between a propagation delay of an analog stimulus signal in response to a clock cycle of the conversion clock signal via the first signal path and a propagation delay of the conversion clock signal of said clock cycle via the second signal path is within a predetermined tolerance range.

In a test system according to one embodiment of the present invention, an automatic testing system may have a first signal converter for converting, using a conversion clock signal, a signal from a digital signal domain to an analog signal domain to acquire an analog stimulus signal; a second signal converter, which is adapted to convert the analog stimulus signal back from the analog signal domain to the digital signal domain; a first signal path between the first and the second signal converter for forwarding the analog stimulus signal from the first signal converter to the second signal converter; and a second signal path between the first and the second signal converter for forwarding the conversion clock signal or a signal derived thereof from the first signal converter to the second signal converter, wherein the first or the second signal path is configured, such that a difference between a propagation delay of an analog stimulus signal in response to a clock cycle of the conversion clock signal via the first signal path and a propagation delay of the conversion clock signal of said clock cycle via the second signal path is within a predetermined tolerance range.

In a method according to one embodiment of the present invention, a mixed signal testing method comprises using a conversion clock signal in a first signal converter to convert a signal from a digital signal domain to an analog signal domain to acquire an analog stimulus signal; forwarding the analog stimulus signal from the first signal converter to a second signal converter, which is adapted to convert the analog stimulus signal back from the analog signal domain to the digital signal domain, via a first signal path between the first and the second signal converter; and forwarding the conversion clock signal or a signal derived thereof from the first signal converter to the second signal converter via a second signal path between the first and the second signal converter, such that a difference between a propagation delay of an analog stimulus signal in response to a clock cycle of the conversion clock signal via the first signal path and a propagation delay of the conversion clock signal of said clock cycle via the second signal path is within a predetermined tolerance range.

In a system according to one embodiment of the present invention, a computer program may execute, when the computer program is running on a computer or micro controller, the mixed signal testing method, wherein the method may have the steps of using a conversion clock signal in a first signal converter to convert a signal from a digital signal domain to an analog signal domain to acquire an analog stimulus signal; forwarding the analog stimulus signal from the first signal converter to a second signal converter, which is adapted to convert the analog stimulus signal back from the analog signal domain to the digital signal domain, via a first signal path between the first and the second signal converter; and forwarding the conversion clock signal or a signal derived thereof from the first signal converter to the second signal converter via a second signal path between the first and the second signal converter, such that a difference between a propagation delay of an analog stimulus signal in response to a clock cycle of the conversion clock signal via the first signal path and a propagation delay of the conversion clock signal of said clock cycle via the second signal path is within a predetermined tolerance range.

In an automatic tester according to one embodiment of the present invention, an automatic tester comprises a first signal converter (AWG or DAC) for converting, using a conversion clock signal, a signal from a digital signal domain to an analog signal domain to obtain an analog stimulus signal. Further, the automatic tester comprises a first signal path for forwarding the analog stimulus signal from the first signal converter to a second signal converter (ADC or digitizer), which is adapted to convert the analog stimulus signal back from the analog signal domain to the digital signal domain. The automatic tester now also comprises a second signal path for forwarding the conversion clock signal or a signal derived thereof from the first signal converter to the second signal converter, such that a difference between a propagation delay of an analog stimulus signal in response to a clock cycle of the conversion clock signal via the first signal path and a propagation delay of the conversion clock signal of said clock cycle via the second signal path is within a predetermined tolerance range, such that a relative jitter between the analog stimulus signal and the forwarded conversion clock signal or the signal derived thereof is kept minimal.

According to further embodiments, an ATE system is provided, comprising a first signal converter for converting, using a conversion clock signal, a signal from a digital signal domain to an analog signal domain to obtain an analog stimulus signal, and a second signal converter, which is adapted to convert the analog stimulus signal back from the analog signal domain to the digital signal domain. The ATE system comprises a first signal path between the first and the second signal converter for forwarding the analog stimulus signal from the first signal converter to the second signal converter, and a second signal path between the first and the second signal converter for forwarding the conversion clock signal or a signal derived therefrom from the first signal converter to the second signal converter. The first and/or the second signal path is configured, such that a difference between a propagation delay of an analog stimulus signal generated in response to a clock cycle of the conversion clock signal via the first signal path and a propagation delay of the conversion clock signal of said clock cycle via the second signal path is within a predetermined tolerance range, such that a relative jitter between the analog stimulus signal and the forwarded conversion clock signal or the signal derived therefrom is kept minimal.

According to further embodiments, a method for automatic testing and a computer program for executing said method are also provided.

According to the embodiments, the difference $\Delta t$ between the propagation delay of the analog stimulus signal via the first signal path and the propagation delay of the conversion clock signal via the second signal path is $$\Delta t \leq (2 \cdot 10^{-dB/20})/(\pi \cdot f_{STIM}), \qquad (2)$$

wherein dB is the target SNR at stimulus signal frequency $f_{STIM}$. According to embodiments, for a target SNR of 70 dBc and $f_{STIM}$=100 MHz, the difference $\Delta t$ is less than 2 ps and, advantageously, less than 1 ps. Additionally or alternatively, the difference $\Delta t$ between the propagation delay of the analog stimulus signal via the first signal path and the propagation delay of the conversion clock signal via the second signal path is less than half a period time of the jitter. This means that the propagation delays via the first signal path and the second signal path should advantageously be essentially the same. That is, a propagation delay which is introduced by the first signal path, e.g. by the physical path length and additional digital or analog circuits, also has to be introduced to the forwarded conversion clock signal by the second signal path (within the precision of less than half a period time of the jitter).

According to some embodiments, a means for generating a further signal derived from the conversion clock signal is foreseen in the second signal path. The further signal derived from the conversion clock signal may be a derived clock signal for the second signal converter. The means for generating the derived clock signal may be a signal converter like the first signal converter, e.g. an AWG or DAC. The means for generating the further signal and the first signal converter are both clocked by the conversion clock signal stemming from one physical clock domain. I.e., the clock signal of the first signal converter and the clock signal of the means for generating are generated by the same clock synthesis block, e.g. a PLL. The analog stimulus signal is forwarded from the first signal converter to the second signal converter using the first signal path. The derived clock signal is forwarded from the means for generating to the second signal converter using the second signal path, wherein the means for generating belongs to the same physical clock domain as the first signal converter. Hence, the means for generating and the first signal converter may be located on the same mixed signal test card.

Changing the conventional ATE architecture for mixed signal testing to the inventive source synchronous architecture using a forwarded conversion clock appears to be promising. The costs and effort to meet the state-of-the-art test requirements appear to be much less than in the case of providing an ultra-low jitter central clock that needs to be distributed without adding jitter through a large and complex test system. The possible penalty to provide at least one additional pogo pin for the forwarded conversion clock in the mixed signal module seems to be justified for a product that is targeted for testing high-speed performance signal converters at a competitive price level even under the constraint of high channel density. Thereby a pogo pin is a device used in electronics to establish a (usually temporary) connection between two printed circuit boards. A pogo pin usually takes the form of a slender cylinder containing two sharp, spring-loaded pins. Pressed between two electronic circuits, the sharp points at each end of the pogo pin make secure contacts with the two circuits and thereby connect them together.

BRIEF DESCRIPTION OF THE DRAWINGS

Embodiments of the present invention will be better understood from the following detailed description, taken in conjunction with the accompanying drawing figures in which like reference characters designate like elements and in which.

DETAILED DESCRIPTION

Figure 1:
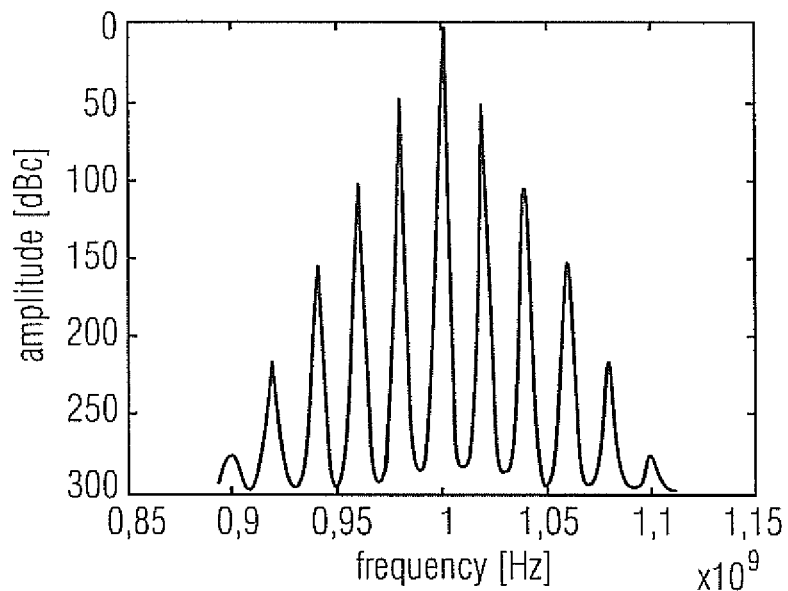
FIG. 1 illustrates an exemplary spectrum of a sampled stimulus signal in the presence of sinusoidal jitter.
Figure 2:
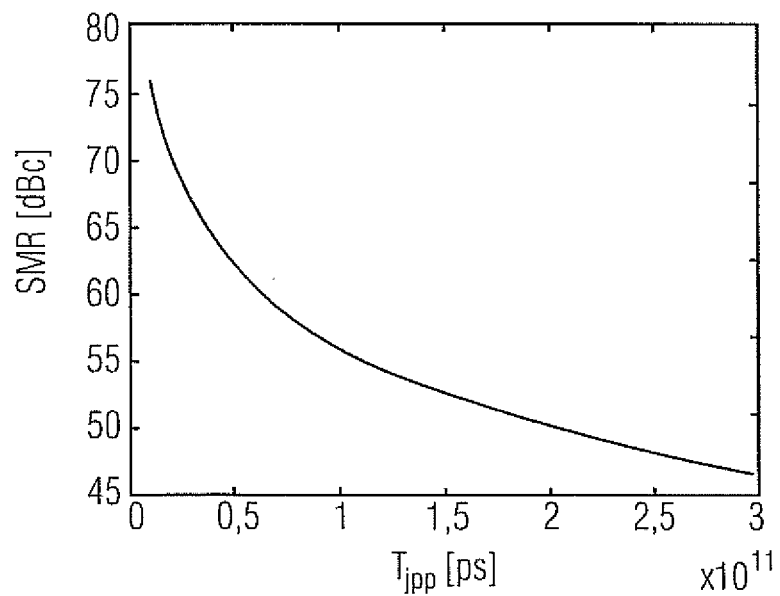
FIG. 2 illustrates a graphical representation of a SNR for a stable input signal in the presence of a sinusoidal sampling clock jitter.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

The following description sets forth specific details such as particular embodiments, procedures, techniques, etc. for purposes of explanation and not limitation. It will be appreciated that other embodiments may be employed apart from these specific embodiments. For example, although the following description is facilitated using non-limiting exemplary applications, the technology may be employed to any type of ATE. In some instances, detailed descriptions of well-known methods, interfaces, circuits and devices are omitted so as to not obscure the description with unnecessary detail. Moreover, individual blocks are shown in some of the figures. The functions of those blocks may be implemented using individual hardware circuits, using software programs and data, in conjunction with a suitably programmed digital micro processor or general purpose computer, using application-specific integrated circuitry (ASIC) and/or using one or more digital signal processors (DSPs).

Embodiments of this present invention provide solutions to the increasing challenges inherent in testing high-speed and high-performance ADCs and DACs in high frequency ranges, where performance limiting factors are determined more and more by jitter in the stimulus and conversion or sampling clock signal. As described herein, various embodiments of the present invention provide for a difference Δt between a propagation delay of an analog stimulus signal in response to a clock cycle of a conversion clock signal CLK and a propagation delay of the conversion clock signal CLK of the clock cycle is within a predetermined tolerance range, such that a relative jitter between the analog stimulus signal STIM and the forwarded conversion clock signal CLK (or a signal CLK' derived thereof) is kept minimal.

Figure 3A:
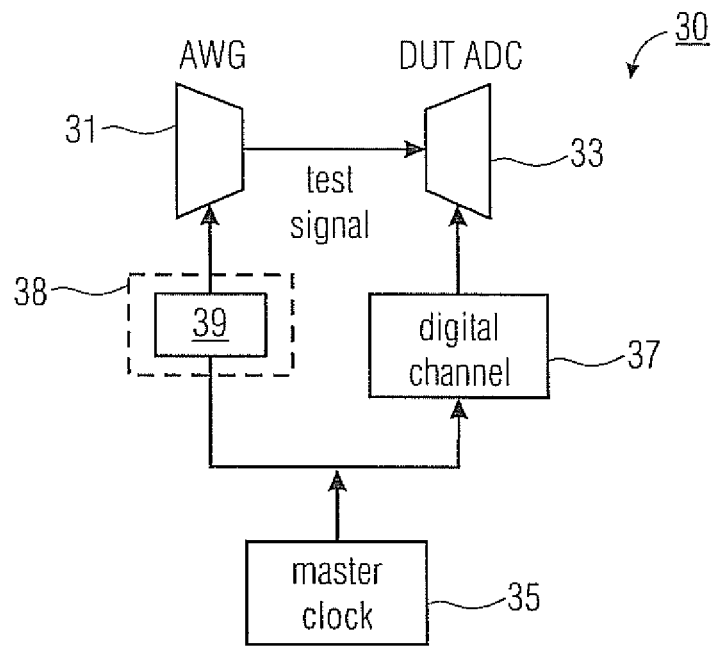
FIG. 3A illustrates an exemplary architecture for an ADC test according to an embodiment of the present invention.

FIG. 3A illustrates an ATE system 30 comprising an AWG 31, an ADC 33 to be tested and a master clock generator 35. The AWG 31 may comprise a first mixed signal test card generating an analog test or stimulus signal. A second test card or loadboard comprises the ADC 33 to be tested. Typically, a digital channel 37 that clocks the DUT ADC 33 and the test card containing the AWG 31 generate their own internal clock signals, respectively, based on a common reference or master clock provided by the master clock generator 35. The analog stimulus signal is generated, e.g., by direct digital synthesis, in a mixed signal channel that derives its AWG conversion clock from a first clock board 38 that is synchronized with a PLL 39 to the broadly distributed master clock provided by the master clock generator 35. The DUT 33, however, samples the analog stimulus signal with a clock provided through the digital channel 37. Consequently, the conversion clock of the AWG 31 stems from a first clock domain, while the conversion clock of the DUT ADC 33 stems from a second clock domain, different from the first clock domain. Since the digital channel 37 does the bit-level timing based on local delay lines, a certain amount of high frequency jitter between the first and the second clock domain can hardly be avoided. With respect to the jitter, the stimulus instrument 31 and the device under test 33 do not operate in a source synchronous way.

Figure 3B:
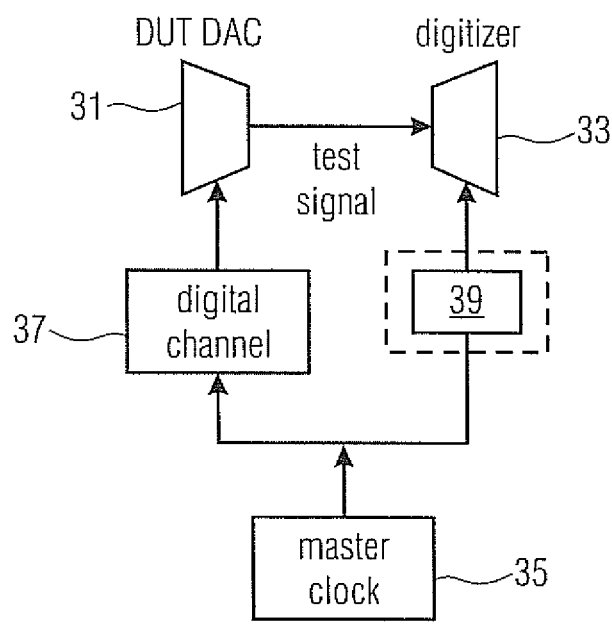
FIG. 3B illustrates an exemplary architecture for a DAC test according to an embodiment of the present invention.

In FIG. 3B the roles of the digital-to-analog converter 31 and the digitizer, such as the ADC 33, are reversed, which means that in the test setup depicted in FIG. 3B, the DAC 31 is the device to be tested (DUT) operating at an internal conversion clock based on the master clock 35 provided through the digital channel 37. Again, the conversion clocks of the DUT DAC 31 and the ADC 33 stem from physically different clock domains using different PLLs to derive the conversion clocks from the master clock 35, respectively.

Figure 4:
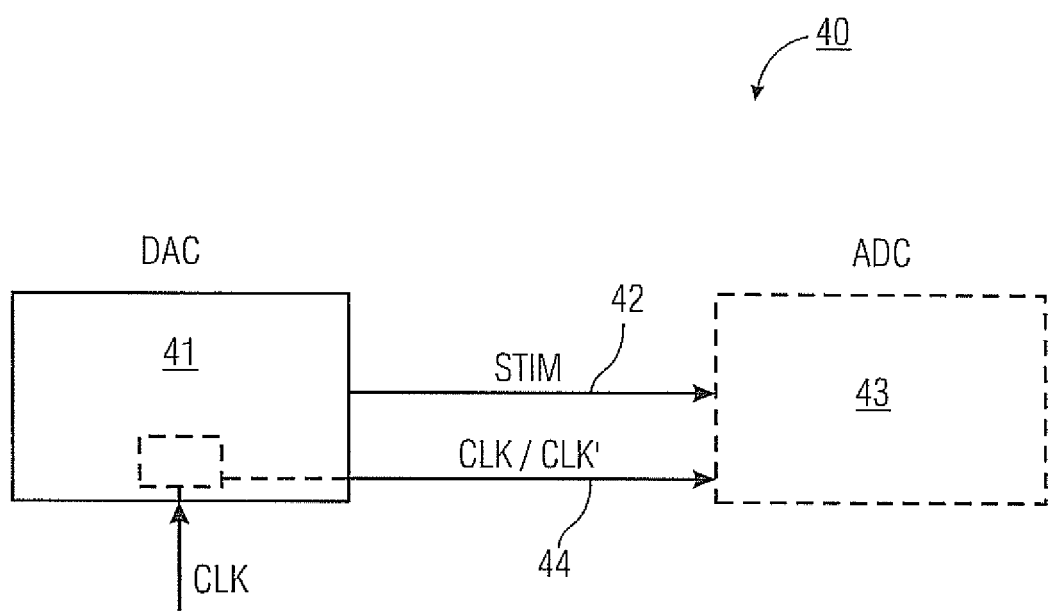
FIG. 4 illustrates an exemplary schematic block diagram of an exemplary automatic tester according to an embodiment of the present invention.

FIG. 4 illustrates an exemplary schematic block diagram of an automatic tester 40, according to an embodiment of the present invention. The automatic tester 40 comprises a first signal converter 41 for converting, using a conversion clock signal CLK, a signal from a digital signal domain to an analog signal domain to obtain an analog stimulus signal STIM. A first signal path 42 is provided for forwarding the analog stimulus signal STIM from the first signal converter 41 to a second signal converter 43, which is adapted to convert the analog stimulus signal STIM back from the analog signal domain to the digital signal domain. Further, a second signal path 44 is provided for forwarding the conversion clock signal CLK (or a signal CLK' derived thereof) from the first signal converter 41 to the second signal converter 43, such that a difference Δt between a propagation delay of an analog stimulus signal in response to a clock cycle of the conversion clock signal CLK via the first signal path 42 and a propagation delay of the conversion clock signal CLK of the clock cycle via the second signal path 44 is within a predetermined tolerance range, such that a relative jitter between the analog stimulus signal STIM and the forwarded conversion clock signal CLK (or the signal CLK' derived thereof) is kept minimal.

In other words, the analog stimulus signal STIM and the conversion clock signal CLK, which is used for generating the analog stimulus signal, as described herein, may both be directly forwarded from the first signal converter 41, which may comprise an AWG or a DAC, to the second signal converter 43, which may comprise an ADC or a digitizer. Thereby, the analog stimulus signal STIM and the conversion clock signal CLK (or CLK') should both experience the same propagation delay from the first to the second signal converter. The clock signal CLK used by the first signal converter 41 to generate the analog stimulus signal STIM is directly forwarded to the second signal converter 43, which is adapted to use the forwarded clock signal CLK (or CLK') to convert the analog stimulus signal STIM back to the digital domain. Depending on the circumstances, the frequency $f_{CLK}$ of the conversion clock signal CLK may also be reduced or increased before or during the forwarding of the conversion clock signal CLK via the second signal path. This may be needed if the conversion clock frequency $f_{CLK}$ is higher or lower than the stimulus frequency $f_{STIM}$. In this case a modified conversion clock signal CLK' arrives at the second signal converter 43.

The modified conversion clock signal CLK' may also be generated by another signal converter (AWG or DAC) channel driven by the same clock domain as the first signal converter 41 (AWG or DAC). That means that the conversion clock signal CLK and the modified conversion clock signal CLK' are generated by the same clock synthesis module on a common test card. This will be explained with reference to FIGS. 6B and 7C.

According to an embodiment of the present invention, the signal paths 42 and 44 are configured, such that the difference $\Delta t$ between the propagation delay of the analog stimulus signal STIM via the first signal path 42 and the propagation delay of the conversion clock signal CLK via the second signal path 44 is less than a period time of the jitter. This shall be illustrated referring to FIG. 5.

Figure 5:
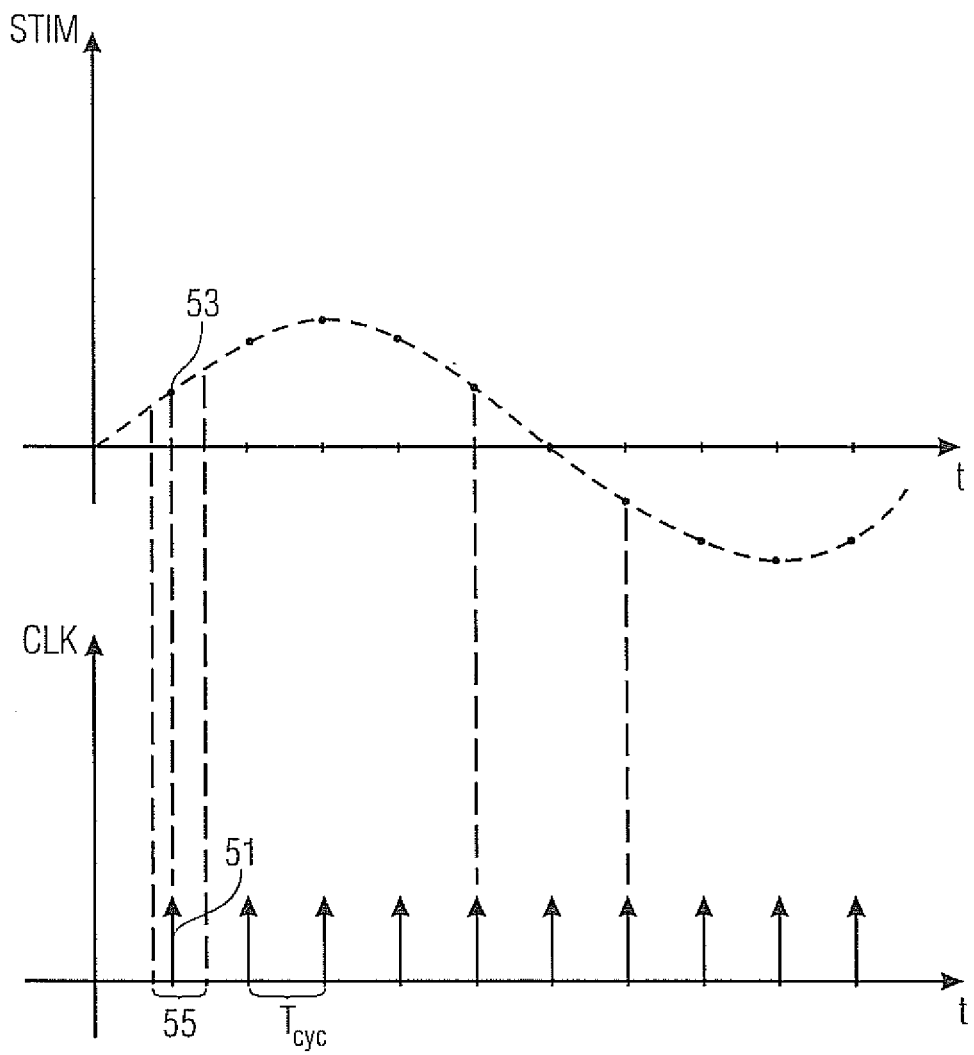
FIG. 5 schematically illustrates exemplary pulses of the conversion clock signal and the resulting stimulus signal versus time, according to an embodiment of the present invention.

FIG. 5 schematically illustrates pulses of the conversion clock signal CLK versus time and the resulting (analog) stimulus signal STIM versus time. As discussed herein, the conversion clock signal CLK may be used to generate digital phase words of a DDS or AWG and corresponding digital and analog amplitude values of the stimulus signal STIM. Hence, each clock cycle of the conversion clock signal CLK comprises a clock pulse 51 of the conversion clock signal CLK. This clock pulse 51 of a clock cycle in return results in a corresponding amplitude value 53 of the analog stimulus signal STIM. As discussed herein, a jitter between the conversion clock signal CLK and the analog stimulus signal STIM introduced by propagation over the second and the first signal path 44, 42, respectively, will not exceed a predetermined tolerance range, which is indicated by reference numeral 55 in FIG. 5. As explained above, the predetermined tolerance range 55 may be less than the duration of $T_{cyc}$ of one clock cycle of the conversion clock signal CLK, or at least less than half a period time of the jitter.

According to a further embodiment, a relationship between the propagation delay of the analog stimulus signal STIM via the first signal path 42 and the propagation delay of the conversion clock signal CLK via the second signal path 44 is in the range of 0.999 to 1.001, which means that the two propagation delays are essentially equal (e.g. within less than half a period time of the jitter).

According to exemplary embodiments, the first and/or second signal path 42, 44 may be plain cable connections between the first and the second signal converter 41, 43. However, the first and/or second signal path 42, 44 may also comprise analog and/or digital circuits, like, e.g., frequency multipliers or frequency dividers for increasing or decreasing the clock frequency $f_{CLK}$. The first and/or second signal path 42, 44 may also comprise analog and/or digital filters as indicated in FIG. 6A.

Figure 6A:
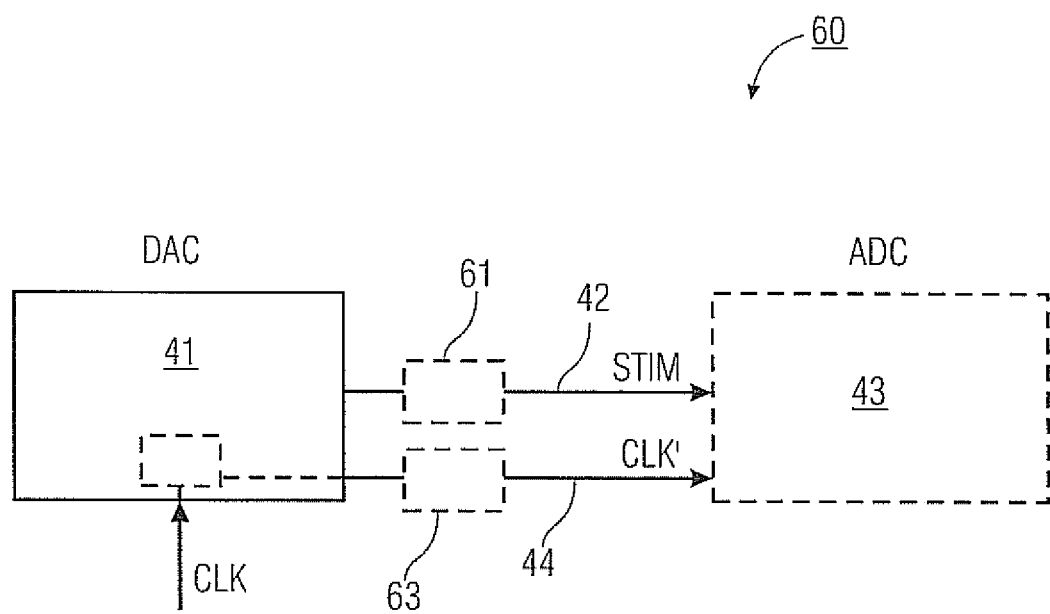
FIG. 6A illustrates an exemplary first circuit in a first signal path and a second circuit in a second signal path from a first signal converter to a second signal converter, according to an embodiment of the present invention.

FIG. 6A illustrates an exemplary first filter 61 in the first signal path 42 for filtering the analog stimulus signal STIM, for example a signal provided by an arbitrary waveform generator. This first filter 61 causes a first time delay $\Delta t_{filt,1}$ to the stimulus signal STIM. The second signal path 44 may optionally comprise a second filter 63 for filtering the conversion clock signal CLK (which may for example comprise a smaller delay than the first filter 61). Accordingly, the jitter of the filtered analog stimulus signal STIM may lag the jitter of the filtered or non-filtered conversion clock signal CLK. This may cause problems if the delay of the first filter 61 approaches half the modulation period of the jitter (assuming that the jitter is at least approximately periodic). Also, it should be noted that the conversion clock signal typically comprises a higher frequency than the analog stimulus signal, such that a filter for filtering the analog stimulus signal (e.g. the first filter 61) typically comprises a lower bandwidth and a higher delay than an (optional) filter for filtering the conversion clock signal.

However, as discussed in detail below, embodiments of the present invention are applicable in a real-world environment, even if a filter (e.g. the first filter 61) is used for filtering the analog stimulus signal. This is due to the fact that a modulation bandwidth of the jitter in test equipment may typically be in an order of a few megahertz, such that a modulation period of the jitter is typically larger than 1 microsecond, while the delay of the first filter is typically (in many technical applications) significantly smaller (for example at least by a factor of 10 smaller or at least by a factor of 100 smaller) than 1 microsecond (or, more generally, than the modulation period of the jitter). For example, jitter sidebands of the analog stimulus signal and the conversion clock signal may comprise a bandwidth of no more than 1 MHz or of no more than 3 MHz in some embodiments, while a typical delay of the first filter may by 10 ns or less, and in some cases even 1 ns or less. Accordingly, as discussed herein, obtaining a reduction of an effective jitter by deriving both the analog stimulus signal STIM and the conversion clock signal CLK from a common clock signal can be successfully used even in the presence of a filter for filtering the analog stimulus signal STIM. Accordingly, the second filter 63 may be omitted, even if the first filter 61 comprises a delay, provided the delay of the first filter is significantly smaller than the jitter period time, such that the test arrangement can be designed at comparatively low cost.

It has also been found that the first filter would only have a significant detrimental effect on the jitter cancellation performance if the delay time of the first filter would be of an order of half a jitter modulation period time, because the jitter of the filtered analog stimulus signal STIM would be 180 degrees out of phase with the jitter of a filtered or non-filtered conversion clock signal CLK, such that the effective jitter would be even increased.

However, in some cases, characteristics of the first and second filters may be adapted. Given that the propagation delays of the signal paths 42, 44 before and after the first and second filters 61, 63 are identical, respectively, the first and second filters 61, 63 may in some embodiments be configured to cause essentially the same time delay to the respective signals STIM, CLK. That is, in case the first filter 61, which may be a low-pass filter, introduces the time delay $\Delta t_{filt,1}$ to the stimulus signal STIM, the second filter 63, which may be an all-pass filter, introduces the same time delay to the clock signal CLK ($\Delta t_{filt,2} = \Delta t_{filt,1}$). Reference numerals 61 and 63 may also be dedicated to other digital or analog circuit elements, such as, e.g., buffer-amplifiers, frequency multipliers and/or frequency dividers. In any case, the overall time delays introduced by the signal paths 42, 44, including the circuit elements 61, 63, may be chosen to be essentially identical. Such an embodiment may be useful even if a modulation period of a jitter is of a same order as the delay time of the first filter, because a 180-degree phase shift (or, more generally, a large phase shift) between the jitter of the analog stimulus signal STIM and the jitter of the conversion clock signal CLK may be avoided.

Figure 6B:
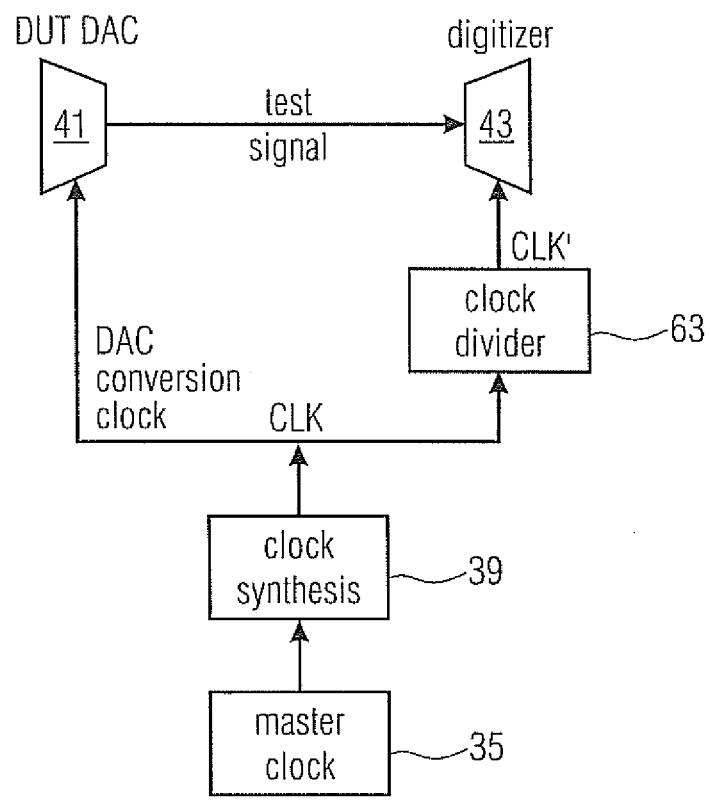
FIG. 6B illustrates an exemplary source synchronous architecture for an exemplary DAC test according to an embodiment of the present invention.

FIG. 6B illustrates an exemplary generation of a modified conversion clock signal CLK' by a frequency or clock divider 63 driven by the same conversion clock signal CLK as the first signal converter 41 (AWG or DAC). The conversion clock signal CLK is synchronized via a clock synthesis module 39, e.g. a PLL, to a broadly distributed master clock provided by the master clock generator 35. Therefore, as illustrated in FIG. 6B, the conversion clock signal CLK and the modified conversion clock signal CLK' may be generated by the same clock synthesis module 39 on a common test card. In other words, the conversion clock signal CLK and the modified conversion clock signal CLK' belong to the same clock domain.

When the first signal converter 41 (AWG or DAC) outputs samples with a timing offset, and the second signal converter (ADC or a digitizer) 43 outputs the stimulus signal STIM (comprising DUT samples) with the same timing offset, correct sample values will be assigned to the correct sample index, and therefore the correct waveform is reconstructed. The same is the case for a DAC output signal in a DUT that gets sampled with a digitizer. In other words, if the jitter in the sampling or conversion clocks on both sides is the same, it will not affect the performance of the test setup.

Figure 7A:
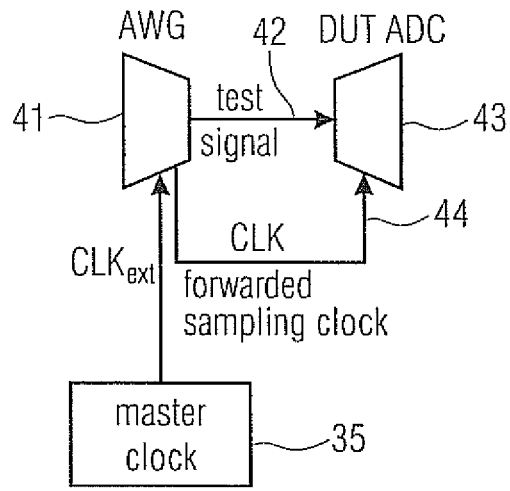
FIG. 7A illustrates an exemplary source synchronous architecture for an exemplary ADC test according to an embodiment of the present invention.
Figure 7B:
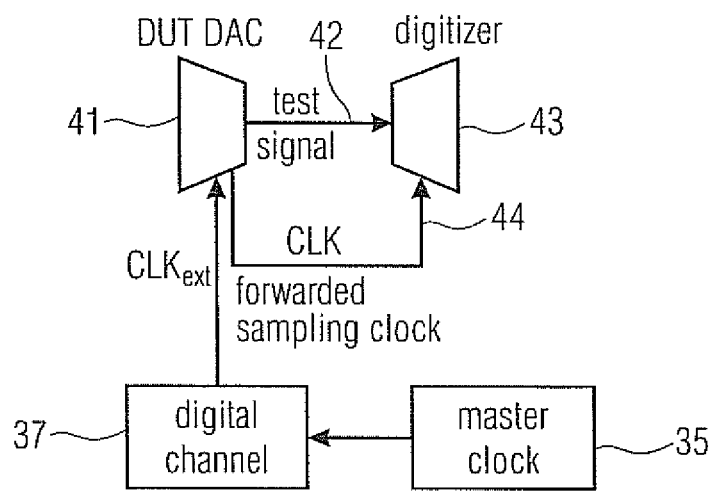
FIG. 7B illustrates an exemplary source synchronous architecture for an exemplary DAC test according to a further embodiment of the present invention.

This suggests that a much higher performance can be expected from a mixed signal module which forwards the sampling or conversion clock of an AWG/DAC to an ADC under test and/or that uses the forwarded sampling or conversion clock of a DAC under test for the digitizer, compared to a conventional ATE architecture that distributes a central clock to both the AWG or digitizer and to digital channels, which in turn generate the sampling clock for the DUT (see FIGS. 3A and 3B). As illustrated in FIGS. 7A and 7B, forwarding of the conversion clock signal in test setups, according to embodiments of the present invention, ensures a source synchronous operation of the stimulus instrument 41 and the ADC or digitizers 43, which may both be devices under test, respectively.

As also illustrated in FIGS. 7A and 7B, the first signal converter 41 may comprise an input for an external clock signal $CLK_{ext}$. In this case, the automated tester may be configured to derive the conversion clock signal CLK for the first signal converter 41 and, hence, also for the second signal converter 43, from the external clock signal $CLK_{ext}$ by means of a phase-locked-loop (not shown). In another exemplary embodiment, the external clock signal $CLK_{ext}$ at the input of the first signal converter 41 may be routed from the first signal converter 41 to the second signal converter 43 to make sure that the relative jitter between the stimulus signal STIM and the external clock signal $CLK_{ext}$ at the first signal converter 41 used for generating the stimulus signal STIM is as small as possible. This is an extreme case of branching the external master clock signal $CLK_{ext}$ as late as possible to obtain a low jitter.

Figure 7C:
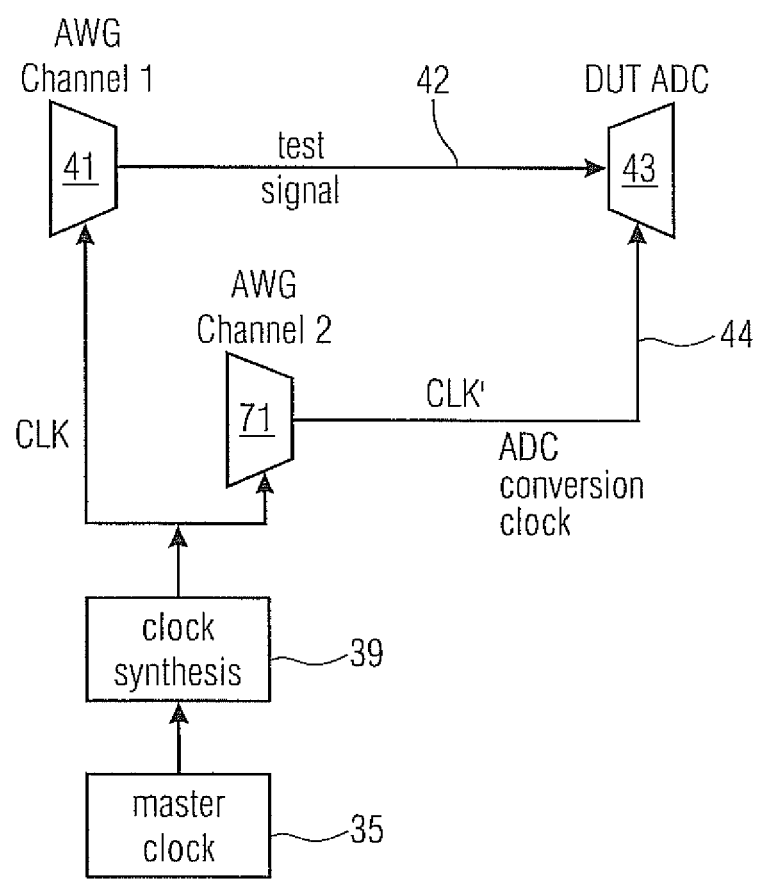
FIG. 7C illustrates an exemplary source synchronous architecture for an exemplary ADC test according to a further embodiment of the present invention.

FIG. 7C illustrates an exemplary generation of a modified conversion clock signal CLK' by a further signal converter 71 (AWG or DAC) driven by the same conversion clock signal CLK as the first signal converter 41 (AWG or DAC). Thereby, the further signal converter 71 is from the same type as the first signal converter 41 (AWG or DAC). The conversion clock signal CLK is synchronized via a clock synthesis module 39, e.g. a PLL, to a broadly distributed master clock provided by the master clock generator 35. In other words, the conversion clock signal CLK and the modified conversion clock signal CLK' are generated by the same clock synthesis module 39 on a common test card. Therefore, the conversion clock signal CLK and the modified conversion clock signal CLK' belong to the same clock domain.

A limitation of the proposed architectural changes, is of course, the difference Δt in propagation delay between the test or stimulus signal STIM and the forwarded sampling or conversion clock signal CLK. The assumption, that a sample, that gets output from the first signal converter 41 with a given timing offset, is assigned to the correct sampling index when it gets sampled by the second signal converter 43 with the same timing offset, is no longer true when there is a considerable delay between the stimulus signal STIM and the sampling clock CLK. It quickly becomes obvious that the larger the delay is, the more jitter can accumulate between the time instant when a sample appears at the input of the ADC and the respective edge of the clock signal CLK that samples it.

Figure 8:
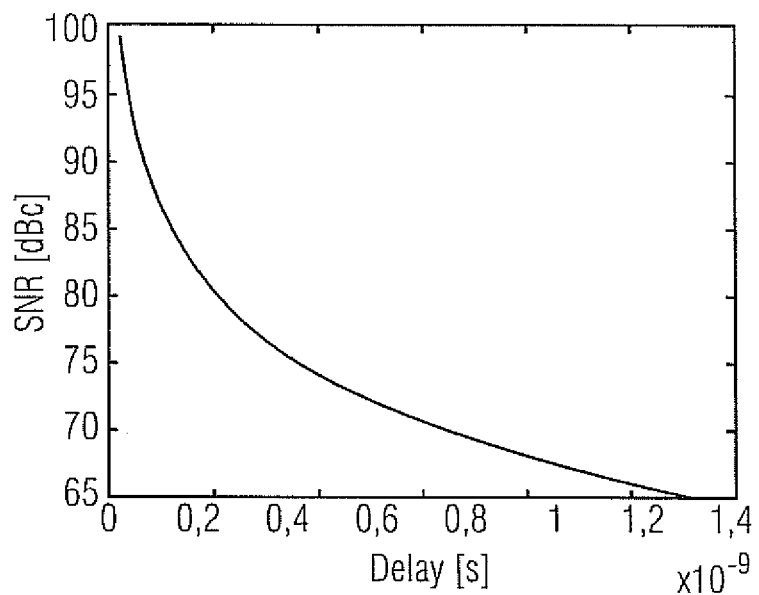
FIG. 8 illustrates an exemplary signal-to-noise ratio caused by jitter accumulation when forwarding a conversion clock signal with a given delay.

In order to assess this limitation, a simulation may be performed that takes a potential delay into account. An exemplary simulation result illustrated in FIG. 8 assumes a test or stimulus signal frequency $f_{STIM}$ of 100 MHz and a sinusoidal jitter of 30 ps with a 14 MHz jitter frequency $f_j$. As can be seen, a delay between the test or stimulus signal STIM and the forwarded sampling clock CLK should not be larger than 1 ns to not exceed the 70 dBc SNR requirement. However, a 1 ns difference in propagation delay means coarsely 0.15 meters of transmission line length in a FR4 (Flame Retardant 4) PCB material. A signal path length matching in this range should be easily possible.

As discussed herein, when testing signal converters in mixed signal devices, the signal converter in the ATE and the signal converter in the DUT form a clock domain with respect to the jitter, since the ATE and the DAC get paired during test. An AWG comprising a DAC is used for testing an ADC, and a digitizer (e.g. an ADC) is used to test a DAC. The data at the digital interfaces to the ADC and the DAC have a certain margin given in setup and hold time, so that they are not affected by small amounts of jitter and can be transferred with a less jitter-clean tester clock. The jitter between the stimulus or test signal and the conversion clocks, however, is what is really crucial for performance.

As discussed herein, only a relative jitter between a ADC conversion clock signal and a stimulus signal provided by a DAC is relevant. That is, cost and development efforts for low-jitter clocks may be minimized because the relevant jitter is a relative phenomenon between the stimulus signal and the conversion clock signal (for sampling or synthesizing) the stimulus signal. When a mixed signal channel provides a signal stimulus using an internal sampling or conversion clock signal to an AWG and this internal sampling or conversion clock signal, or a fraction or a multiple thereof, is forwarded directly to the ADC, then the jitter between both is minimal, provided they both have the same propagation delay from the AWG to the ADC. As discussed herein, directly forwarding means forwarding a signal without any timing formatting, e.g. by means of digital delay elements, relative to the analog stimulus, which is typically the case when forwarding signals through digital channels. In this case, the ADC does not see any amount of the jitter visible relative to an external reference contained in a commonly used sampling clock.

Apart from this, a low jitter may also be achieved when an AWG- or DAC-conversion clock signal and an ADC-conversion clock signal are both generated by means of a common clock signal belonging to a common physical clock domain and wherein a stimulus signal resulting from the AWG- or DAC-conversion clock signal and the ADC conversion clock signal are then both forwarded directly to the DUT ADC.

Exemplary costs and efforts to meet state-of-the-art test requirements appears to be much less than when providing test setups with low-jitter master clocks that need to be distributed without adding jitter to a large and complex test system. Any penalty to provide additional pogo pins for the forwarded clock signal in the mixed signal module seems to be justified for a product that is targeted for testing high speed high performance converters at a competitive price level even under the constraint of a high channel density.

Although some aspects of the present invention have been described referring to an automatic test apparatus, it should be understood that these aspects also serve as a description of a corresponding test method, such that a block or an element of the automatic tester is also to be understood as a corresponding step or a feature of a step of the inventive test method. Hence, embodiments of the present invention also provide a testing method, the method comprising using a conversion clock signal CLK in a first signal converter 41 to convert a signal from a digital signal domain to an analog signal domain to obtain an analog stimulus signal STIM. The method continues by forwarding, via a first signal path 42, the analog stimulus signal STIM from the first signal converter 41 to a second signal converter 43, which is adapted to convert the analog stimulus signal STIM back from the analog signal domain to the digital signal domain, and forwarding the conversion clock signal CLK or a signal derived thereof CLK' from the first signal converter 41 to the second signal converter 43 via a second signal path 44 between the first and the second signal converter. The difference between a propagation delay of an analog stimulus signal in response to a clock cycle of the conversion clock signal CLK via the first signal path 42 and a propagation delay of the conversion clock signal of said clock cycle via the second signal 44 path will be within a predetermined tolerance range. The relative jitter between the analog stimulus signal STIM and the forwarded conversion clock signal CLK or the signal derived thereof will be kept minimal.

Depending on the circumstances, embodiments of may be implemented in hardware or software. An exemplary implementation may be on a digital storage medium, particularly a disc, CD or a DVD with electronically readable control signals, which may cooperate with a programmable computer system, such that the respective method is executed. In general, the invention thus also consists of a computer program product with a computer program code stored on a machine-readable carrier for performing the inventive method when the computer program product runs on a computer or micro controller. In other words, the invention may thus be realized as a computer program with a program code for performing the methods or testing when the computer program runs on a computer or micro controller.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An automatic tester, comprising:
   a first signal converter operable to convert, using a conversion clock signal, a signal from a digital signal domain to an analog signal domain to acquire an analog stimulus signal;
   a first signal path operable to forward the analog stimulus signal from the first signal converter to a second signal converter operable to convert the analog stimulus signal back from the analog signal domain to the digital signal domain; and
   a second signal path operable to forward one of the conversion clock signal and a signal derived thereof from the first signal converter to the second signal converter, wherein a difference between a propagation delay of an analog stimulus signal in response to a clock cycle of the conversion clock signal via the first signal path and a propagation delay of the conversion clock signal of the clock cycle via the second signal path is within a predetermined tolerance range.

2. The automatic tester of claim 1, wherein the difference between the propagation delay of the analog stimulus signal via the first signal path and the propagation delay of the conversion clock signal via the second signal path is less than a duration of one clock cycle of the conversion clock signal.

3. The automatic tester of claim 1, wherein a ratio between the propagation delay of the analog stimulus signal via the first signal path and the propagation delay of the conversion clock signal via the second signal path is in the range of 0.999 to 1.001.

4. The automatic tester of claim 1, wherein the difference between the propagation delay of the analog stimulus signal via the first signal path and the propagation delay of the conversion clock signal via the second signal path is less than $(2 \cdot 10^{-70\ dB/20})/(\pi \cdot f_{STIM})$, wherein $f_{STIM}$ is a frequency of the analog stimulus signal.

5. The automatic tester of claim 1 further comprising a generator operable to generate a further clock signal derived from the conversion clock signal, wherein the generator and the first signal converter are both clocked by the conversion clock signal, and wherein the second signal path is operable to forward the further clock signal to the second signal converter.

6. The automatic tester of claim 1, wherein the first signal path comprises a first filter for filtering the analog stimulus signal, wherein the first filter causes a first time delay to the analog stimulus signal, and wherein the second signal path comprises a second filter for filtering the conversion clock signal, wherein the second filter essentially causes the first time delay to the conversion clock signal.

7. The automatic tester of claim 6, wherein the first filter is a low-pass filter and wherein the second filter is an all-pass filter.

8. The automatic tester of claim 1 further comprising an input for an external clock signal, wherein the automatic tester is further operable to derive the conversion clock signal for the first signal converter from the external clock signal by means of a phase-locked-loop.

9. The automatic tester of claim 1, wherein the first or second signal path is an analog channel or a mixed signal channel.

10. The automatic tester of claim 1, wherein the first and second signal path comprise equal path lengths.

11. The automatic tester of claim 1, wherein the first and the second signal path are configured to directly forward the analog stimulus signal and the conversion clock signal or the signal derived thereof from the first signal converter to the second signal converter.

12. An automatic testing system, comprising:
    a first signal converter operable to convert, using a conversion clock signal, a signal from a digital signal domain to an analog signal domain to acquire an analog stimulus signal;
    a second signal converter operable to convert the analog stimulus signal back from the analog signal domain to the digital signal domain;
    a first signal path operable to forward the analog stimulus signal from the first signal converter to the second signal converter; and
    a second signal path operable to forward one of the conversion clock signal and a signal derived thereof from the first signal converter to the second signal converter, wherein the first signal path or the second signal path is configured so that a difference between a propagation delay of an analog stimulus signal in response to a clock cycle of the conversion clock signal via the first signal path and a propagation delay of the conversion clock signal of the clock cycle via the second signal path is within a predetermined tolerance range.

13. The automatic testing system according to claim 12, wherein the first signal converter comprises an digital-to-analog converter operable to convert, at each clock-cycle of the conversion clock signal, a signal from the digital domain to the analog domain to acquire an analog sinusoidal signal as the stimulus signal, and wherein the second signal converter comprises an analog-to-digital converter operable to convert, at each clock-cycle of the conversion clock signal or the signal derived thereof, the stimulus signal back from the analog to the digital domain.

14. The automatic testing system according to claim 12, wherein the first signal converter is a device under test.

15. The automatic testing system according to claim 12, wherein the second signal converter is a device under test.

16. A mixed signal testing method, the method comprising:
- converting a signal from a digital signal domain to an analog signal domain to acquire an analog stimulus signal, wherein the converting is performed by a first signal converter using a conversion clock signal;
- forwarding the analog stimulus signal from the first signal converter to a second signal converter via a first signal path, wherein the second signal converter is operable to convert the analog stimulus signal back from the analog signal domain to the digital signal domain; and
- forwarding one of the conversion clock signal and a signal derived thereof from the first signal converter to the second signal converter via a second signal path, wherein a difference between a propagation delay of an analog stimulus signal in response to a clock cycle of the conversion clock signal via the first signal path and a propagation delay of the conversion clock signal of said clock cycle via the second signal path is within a predetermined tolerance range.

17. A non-transitory computer-readable storage medium having stored thereon, computer executable instructions that, if executed by a micro-controller or computer system cause the micro-controller or computer system to perform a mixed signal testing method, the method comprising:
- converting a signal from a digital signal domain to an analog signal domain to acquire an analog stimulus signal, wherein the converting is performed by a first signal converter using a conversion clock signal;
- forwarding the analog stimulus signal from the first signal converter to a second signal converter via a first signal path, wherein the second signal converter is operable to convert the analog stimulus signal back from the analog signal domain to the digital signal domain; and
- forwarding one of the conversion clock signal and a signal derived thereof from the first signal converter to the second signal converter via a second signal path, wherein a difference between a propagation delay of an analog stimulus signal in response to a clock cycle of the conversion clock signal via the first signal path and a propagation delay of the conversion clock signal of said clock cycle via the second signal path is within a predetermined tolerance range.

* * * * *